(12) United States Patent
Gardner et al.

(10) Patent No.: US 12,148,668 B2
(45) Date of Patent: Nov. 19, 2024

(54) STACKABLE SEMICONDUCTOR DEVICE WITH 2D MATERIAL LAYER AND METHODS OF MANUFACTURING THEREOF

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 452 days.

(21) Appl. No.: 17/578,403

(22) Filed: Jan. 18, 2022

(65) Prior Publication Data

US 2023/0231058 A1  Jul. 20, 2023

(51) Int. Cl.
| | |
|---|---|
| H01L 21/8234 | (2006.01) |
| H01L 29/786 | (2006.01) |
| H01L 29/792 | (2006.01) |
| H01L 49/02 | (2006.01) |
| H10B 43/27 | (2023.01) |

(52) U.S. Cl.
CPC ........ *H01L 21/823412* (2013.01); *H01L 21/823431* (2013.01); *H01L 28/75* (2013.01); *H01L 29/78696* (2013.01); *H01L 29/7926* (2013.01); *H10B 43/27* (2023.02)

(58) Field of Classification Search
CPC ..... H01L 21/823412; H01L 21/823431; H01L 21/823807; H01L 21/823821; H01L 21/8256; H01L 27/0688; H01L 27/088; H01L 27/0886; H01L 28/75; H01L 29/1605; H01L 29/24; H01L 29/41791; H01L 29/42392; H01L 29/66045; H01L 29/66795; H01L 29/66969; H01L 29/785; H01L 29/78603; H01L 29/78696; H01L 29/7926; H10B 43/27

See application file for complete search history.

(56) References Cited

U.S. PATENT DOCUMENTS 11,251,307 B2 * 2/2022 Park ................. H01L 29/66969

* cited by examiner

*Primary Examiner* — Cheung Lee
(74) *Attorney, Agent, or Firm* — Foley & Lardner LLP

(57) ABSTRACT

Example implementations can include a device with a core including a first dielectric material, the core having a mesa structure, a first layer disposed over opposite faces of the mesa structure of the core, the first layer including a metal material, and a second layer disposed over the mesa structure of the core and the first layer, the second layer including a two-dimensional material. Example implementations can include a method of manufacturing a stackable semiconductor device with a two-dimensional material layer, by depositing, over a substrate, a base layer including a first dielectric material, forming, on the base layer, at least one core having a mesa structure, forming sidewalls on opposite vertical surfaces of the mesa structure of the core, depositing, over the core and the sidewalls, a semiconductor layer including a two-dimensional material, and encapsulating the core, the sidewalls, and the semiconductor layer.

20 Claims, 20 Drawing Sheets

STACKABLE SEMICONDUCTOR DEVICE WITH 2D MATERIAL LAYER AND METHODS OF MANUFACTURING THEREOF

TECHNICAL FIELD

The claimed invention relates generally to semiconductor devices, and more particularly to a stackable semiconductor device with a two-dimensional (2D) material layer and methods of manufacturing thereof.

BACKGROUND

Semiconductor devices are increasingly desired to accommodate smaller form factors and provide higher computational throughput. As volume requirements for semiconductor devices decrease further to realize increasingly compact and portable electronic devices of many types, semiconductor devices are increasingly expected to accommodate volumes and provide computation that matches accordingly. Conventional devices cannot efficiently and effectively accommodate reduced volume requirements by simply reducing the device size alone. Improved fabrication processes and fabricated devices that can accommodate high density configurations is thus desired.

SUMMARY

Present implementations may include a dielectric core that may receive and bond with 2D material during 2D material deposition. Such a deposition may achieve, for example, an isolated core transistor channel region. Embodiments may include a vertical nanometer-scale sheet of dielectric on which a tri-gate 2D material device can be fabricated. Transistor channel regions can be at least partially formed of 2D material and can include terminal contacts located on a top surface of the device. Device connections to other stacked semiconductor devices can thus be made from the top surface of the device. Various embodiments can include highly dense stacks of semiconductor devices having an arbitrary stack height while maintaining reliable computation.

Embodiments can include 2D material channels that can enhance speed of transistors, due to high mobility therethrough relative to Si and Ge channels. 2D material can include but is not limited to graphene. Embodiments can include a 2D Material on three-sided channel device. As one example, transistor speed improvement can be achieved over a one-sided 2D material device. Thus, a technological solution for a stackable semiconductor device with a two-dimensional material layer and methods of manufacturing thereof are provided.

In one embodiment, a device may comprise a dielectric material; a first metal sidewall on the dielectric material, the first metal sidewall extending perpendicular to a substrate; a second metal sidewall on an opposing side of the dielectric material; and a two-dimensional material disposed on the first metal sidewall, on the dielectric material between the first metal sidewall and the second metal sidewall, and on the second metal sidewall.

The two-dimensional material may be disposed on a vertical surface and upper horizontal surface of first metal sidewall, on the dielectric core between the first metal sidewall and the second metal sidewall, and on a vertical surface and upper horizontal surface of the second metal sidewall. The device may further comprise a second dielectric material separated from the dielectric material by an isolating material; a third metal sidewall on the second dielectric material, the third metal sidewall extending perpendicular to the substrate; a fourth metal sidewall on an opposing side of the second dielectric material; and a second two-dimensional material disposed on the third metal sidewall, the second dielectric material between the third metal sidewall and the fourth metal sidewall, and the fourth metal sidewall. The device may further comprise a high-k dielectric on the two-dimensional material. The device may further comprise a gate electrode disposed on the high-k dielectric, the gate electrode having ends each respectively aligned, along the first lateral direction, with a corresponding one of the first and second metal sidewalls. The device may further comprise a gate terminal in contact with the gate electrode; a source terminal extending through the high-k dielectric and in contact with the first metal sidewall; and a drain terminal extending through the high-k dielectric material and in contact with the second metal sidewall. The device may further comprise a second dielectric surrounding the dielectric material, the first metal sidewall, the second metal sidewall, the two dimensional material, the gate electrode, and the high-k dielectric. The second dielectric may comprise silicon nitride.

In another embodiment, a method of manufacturing a stackable semiconductor device may comprise depositing a dielectric base layer; forming, over the dielectric base layer, at least one dielectric core structure; forming a first metal sidewall and second metal sidewall on the dielectric core; and depositing a two-dimensional material on the first metal sidewall, the dielectric core between the first metal sidewall and the second metal sidewall, and the second metal sidewall.

The method may further comprise forming a high-k dielectric layer on the two-dimensional material. The method may further comprise forming a gate electrode on the high-k dielectric layer. The method may further comprise depositing a dielectric layer on the base layer; and removing at least a portion of the dielectric layer to form the dielectric core. The method may further comprise coating the dielectric core with a metal layer; and removing at least a portion of the metal layer to form the first and second metal sidewalls on the dielectric core. The method may further comprise depositing a gate layer on the two-dimensional material. The method may further comprise depositing an electrode layer on the gate layer; and removing at least a portion of the electrode layer to form, over the dielectric core and over the gate layer, the gate electrode, wherein ends of the gate electrode are each respectively aligned, along a lateral direction, with a corresponding one of the first and second metal sidewalls. The method may further comprise forming a gate terminal contacting the gate electrode. The method may further comprise forming a source terminal contacting the first metal sidewall. The method may further comprise forming a drain terminal contacting the second metal sidewall.

In yet another embodiment, a method of manufacturing a device may comprise forming a dielectric core; forming a first metal layer and second metal layer on opposing sidewalls of the dielectric core; depositing a two-dimensional material on a vertical surface and upper horizontal surface of first metal layer, the dielectric core between the first metal layer and the second metal layer, and on a vertical surface and upper horizontal surface of the second metal layer; forming a high-k dielectric on the two-dimensional material; forming a gate electrode on the high-k dielectric; forming a gate terminal to an upper side of the gate electrode; forming a source terminal to an upper side of the first metal sidewall; and forming a drain terminal to an upper side of the second metal sidewall.

The method may further comprise forming a second dielectric core isolated from the dielectric core; forming a third metal sidewall and fourth metal sidewall on the second dielectric core; depositing a second two-dimensional material on the third metal sidewall, the second dielectric core between the third metal sidewall and the fourth metal sidewall, and the fourth metal sidewall; forming a second gate electrode on the second dielectric core; forming a second gate terminal to an upper side of the second gate electrode; forming a second source terminal to an upper side of the third metal sidewall; and forming a second drain terminal to an upper side of the fourth metal sidewall.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

It is to be understood that steps indicated herein do not exclude steps that may occur before, after or between those various steps. It is to be further understood that numbers or ordinals of particular steps are not to indicate a particular absolute order of steps. It is to be further understood that any step discussed herein can be combined with any other step or can be divided into multiple steps, in accordance with present implementations.

Figure 1:
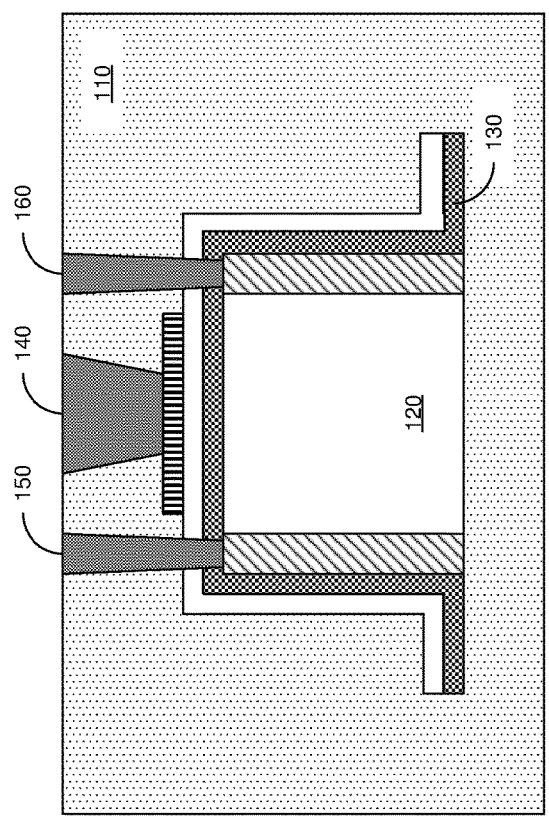
FIG. 1 illustrates a device, according to an embodiment.

FIG. 1 illustrates a device, according to an embodiment. The device 100 can include an encapsulation 110, a transistor core 120, a two-dimensional layer 130, a gate terminal 140, a source terminal 150, and a drain terminal 160.

Figure 2A:
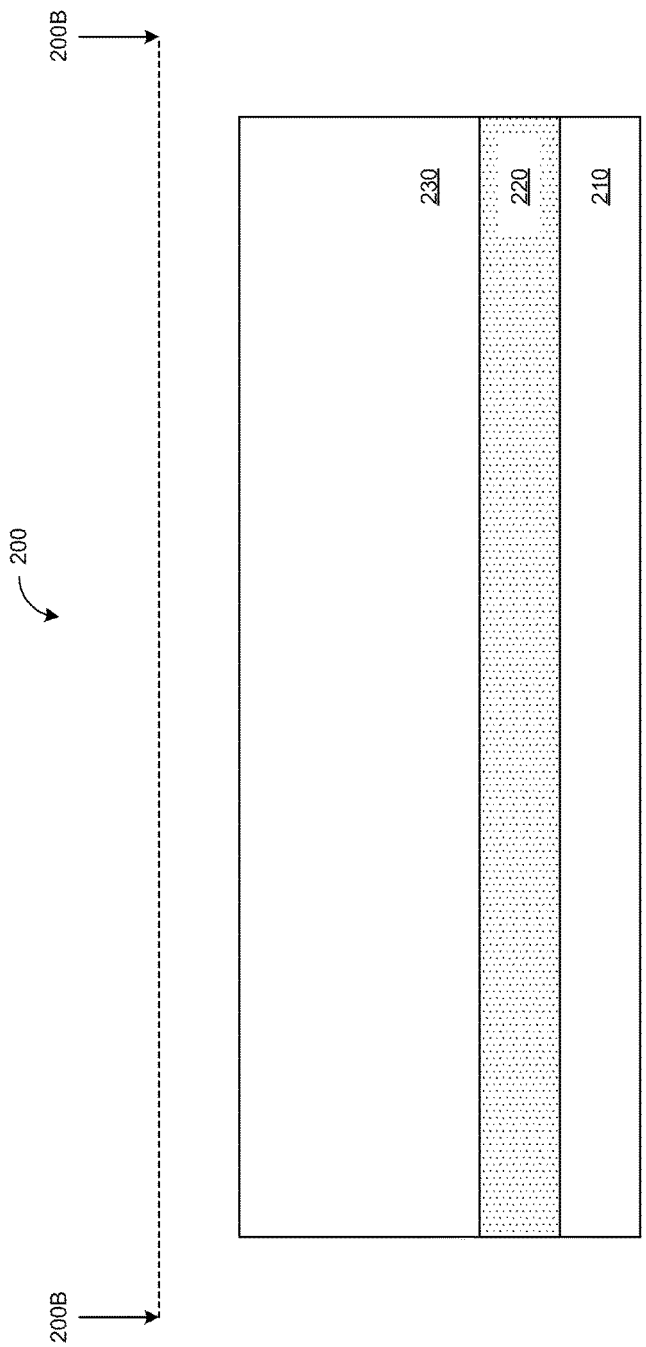
FIG. 2A illustrates a side view of a first step of fabricating a device, according to an embodiment.

FIG. 2A illustrates a side view of a first step of fabricating a device shown in FIG. 1, according to an embodiment. A partially fabricated device 200 in a side view 200A can include a substrate 210, a dielectric base layer 220, and a dielectric core layer 230.

The substrate 210 can include any solid or solid-like material. As one example, the substrate 210 can include glass, metal, or the like. In some other embodiments, the substrate 210 can include a semiconductor material such as, for example, silicon. The dielectric base layer 220 can include a dielectric material having a particular dielectric constant or characteristic, for example. The dielectric base layer 220 can include silicon nitride. The dielectric core layer 230 can include a dielectric material having a particular dielectric constant or characteristic, for example. The dielectric core layer 230 can include an oxide. In general, the dielectric base layer 220 and dielectric core layer 230 may have different materials or the same material with different compositions and an etching selectivity for a certain etchant is present between the dielectric base layer 220 and dielectric core layer 230.

Figure 2B:
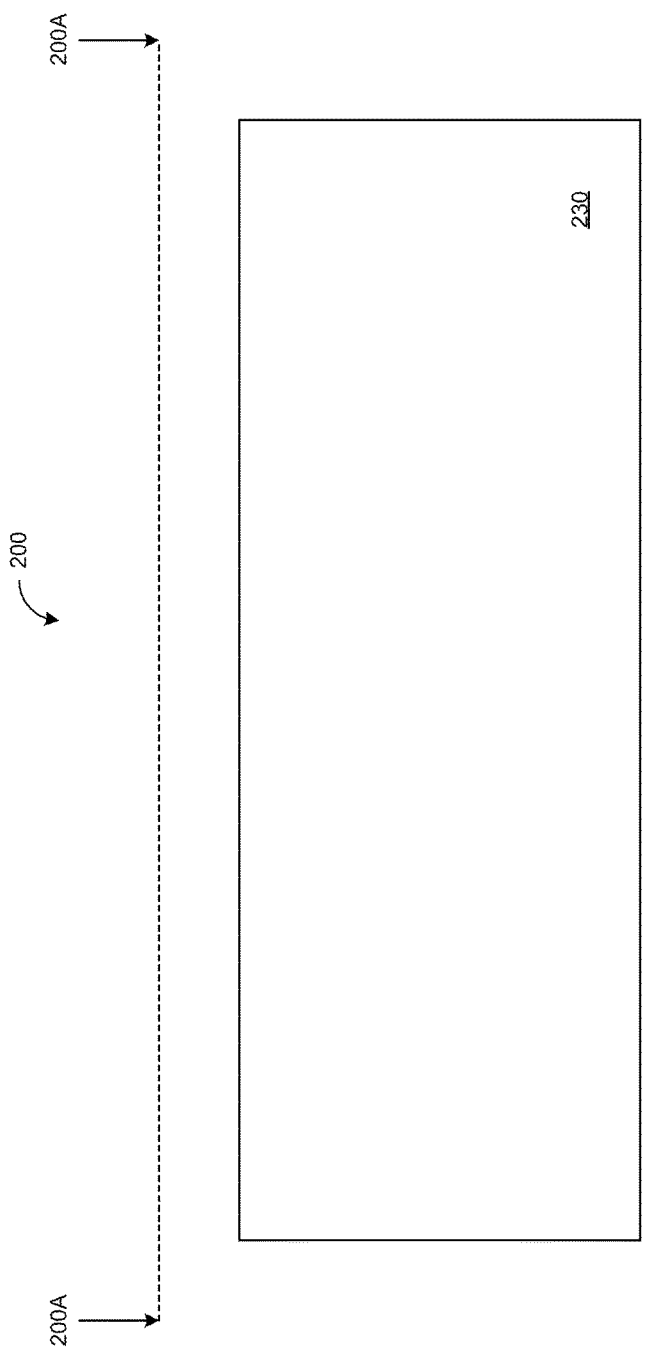
FIG. 2B illustrates a plan view of a first step of fabricating a device, further to the side view of FIG. 2A, according to an embodiment.

FIG. 2B illustrates a plan view of a first step of fabricating a device, further to the side view of FIG. 2A, according to an embodiment. The partially fabricated device 200 in a plan view 200B can include the dielectric core layer 230.

Figure 3:
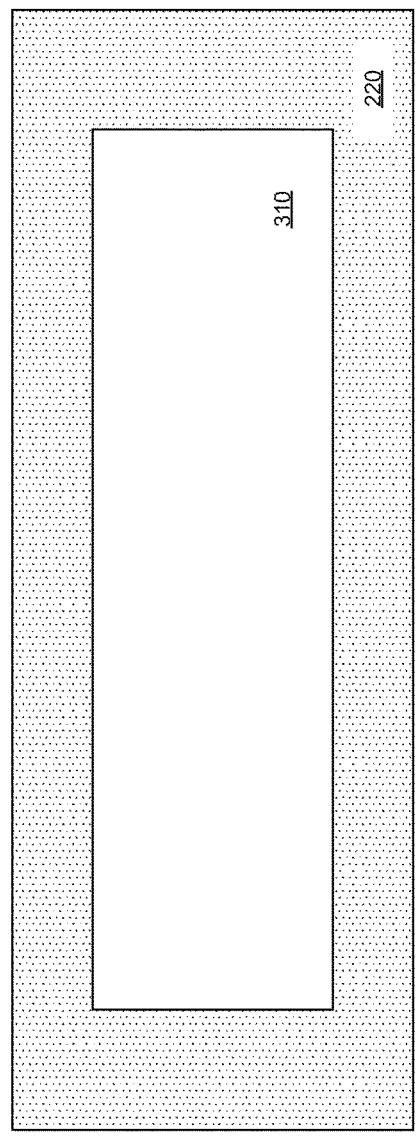
FIG. 3 illustrates a plan view of a second step of fabricating a device, according to an embodiment.

FIG. 3 illustrates a plan view of a second step of fabricating a device, according to an embodiment. A partially fabricated device in a plan view 300 can include the dielectric base layer 220 and a dielectric core 310. The dielectric core 310 can be a portion of the dielectric core layer 230 remaining after a patterning process (e.g., a dry and/or wet etching process following the formation of a mask layer over the workpiece, for example). The dielectric core 310 can include one or more substantially vertical sidewalls disposed within a particular distance from a perimeter of the dielectric base layer in a plan view. The dielectric core 310 can have a mesa structure. The mesa structure can include at least one top surface of the dielectric core 310 oriented above and substantially parallel with a bottom surface of the dielectric core 310 and can include one or more sidewalls connecting the top surface and the bottom surface. As one example, a mesa structure can include, but is not limited to, a cube, a rectangular cuboid, a trapezoidal prism, and any combination thereof.

Figure 4:
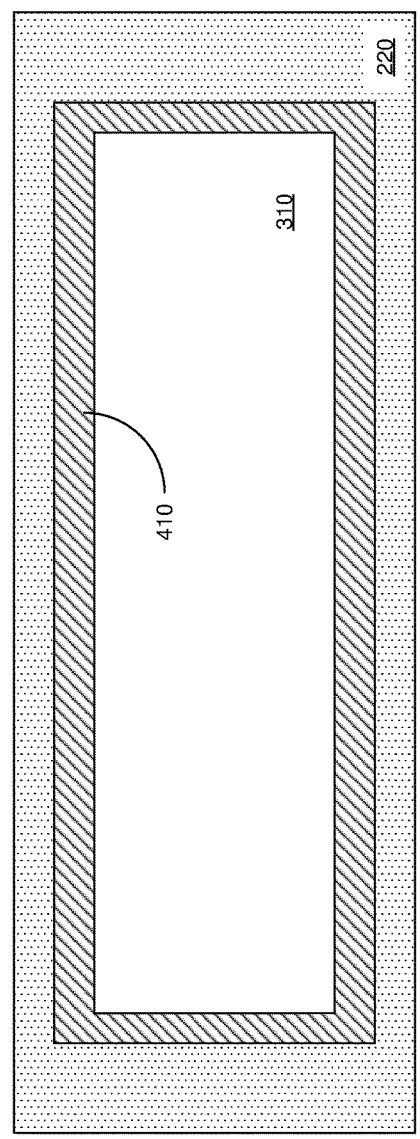
FIG. 4 illustrates a plan view of a third step of fabricating a device, according to an embodiment.

FIG. 4 illustrates a plan view of a third step of fabricating a device, according to an embodiment. A partially fabricated device in a plan view 400 can include the dielectric base layer 220, the dielectric core 310, and a metal sidewall 410. The metal sidewall 410 can at least partially surround one or more of the substantially vertical sidewalls of the dielectric core layer 310.

Figure 5A:
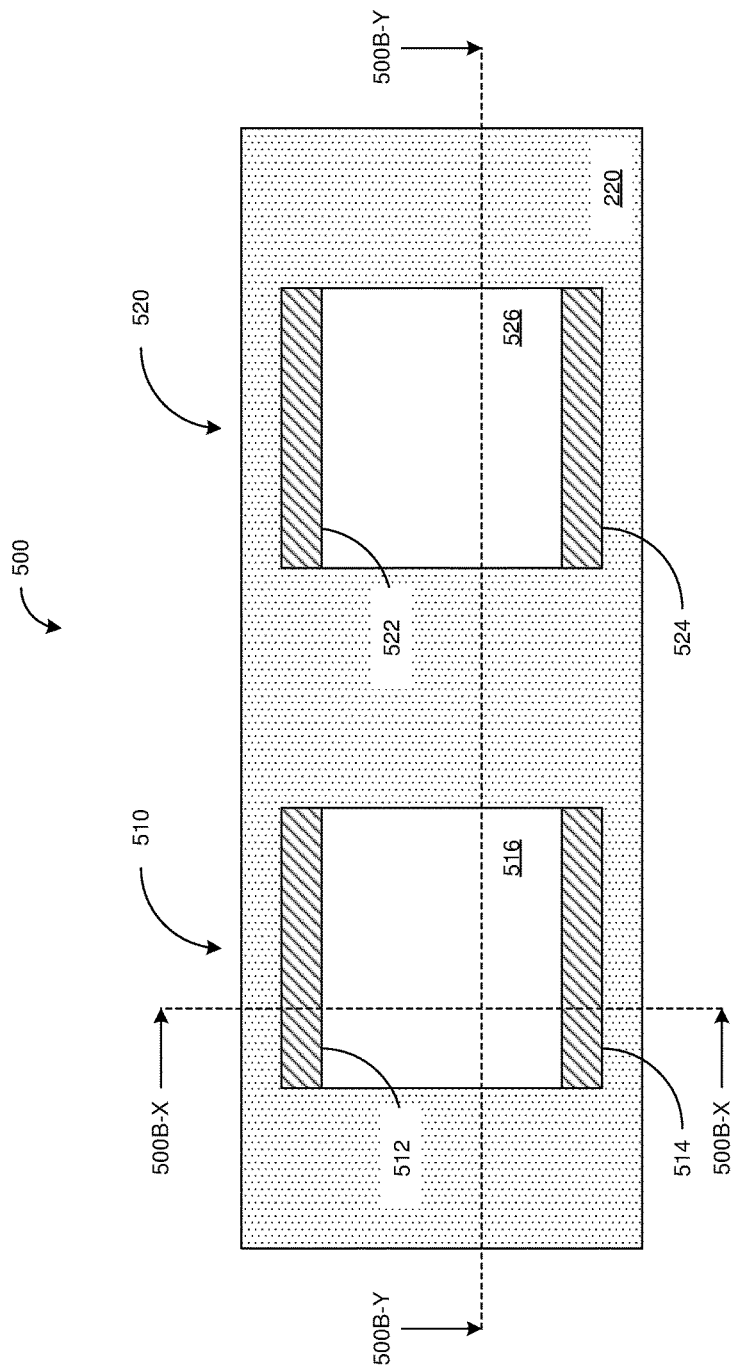
FIG. 5A illustrates a plan view of a fourth step of fabricating a device, according to an embodiment.

FIG. 5A illustrates a plan view of a fourth step of fabricating a device, according to an embodiment. A partially fabricated device 500 in a plan view 500A can include a first transistor core 510 and a second transistor core 520.

The first transistor core 510 can include first sidewalls 512 and 514 disposed on opposite sides of a first dielectric core 516 of the first transistor core 510. The first sidewalls 512 and 514 can be portions of the metal sidewall 410 remaining after a patterning process (e.g., a dry and/or wet etching process following the formation of a mask layer over the workpiece). The etching process of such a patterning process may stop at the dielectric base layer 220, in some embodiments. The first dielectric core 516 can be a portion of the dielectric core 310 remaining after the same or different patterning process (e.g., a dry and/or wet etching process following the formation of a mask layer over the workpiece). The second dielectric core 526 can include second sidewalls 522 and 524 disposed on opposite sides of a second dielectric core 526 of the second transistor core 520. The second sidewalls 522 and 512 can be portions of the metal sidewall 410 remaining after the same or different patterning process (a dry and/or wet etching process following the formation of a mask layer over the workpiece, for example). The second dielectric core 526 can be a portion of the dielectric core 310 remaining after the same or different patterning process (e.g., a dry and/or wet etching process following the formation of a mask layer over the workpiece).

Figure 5B:
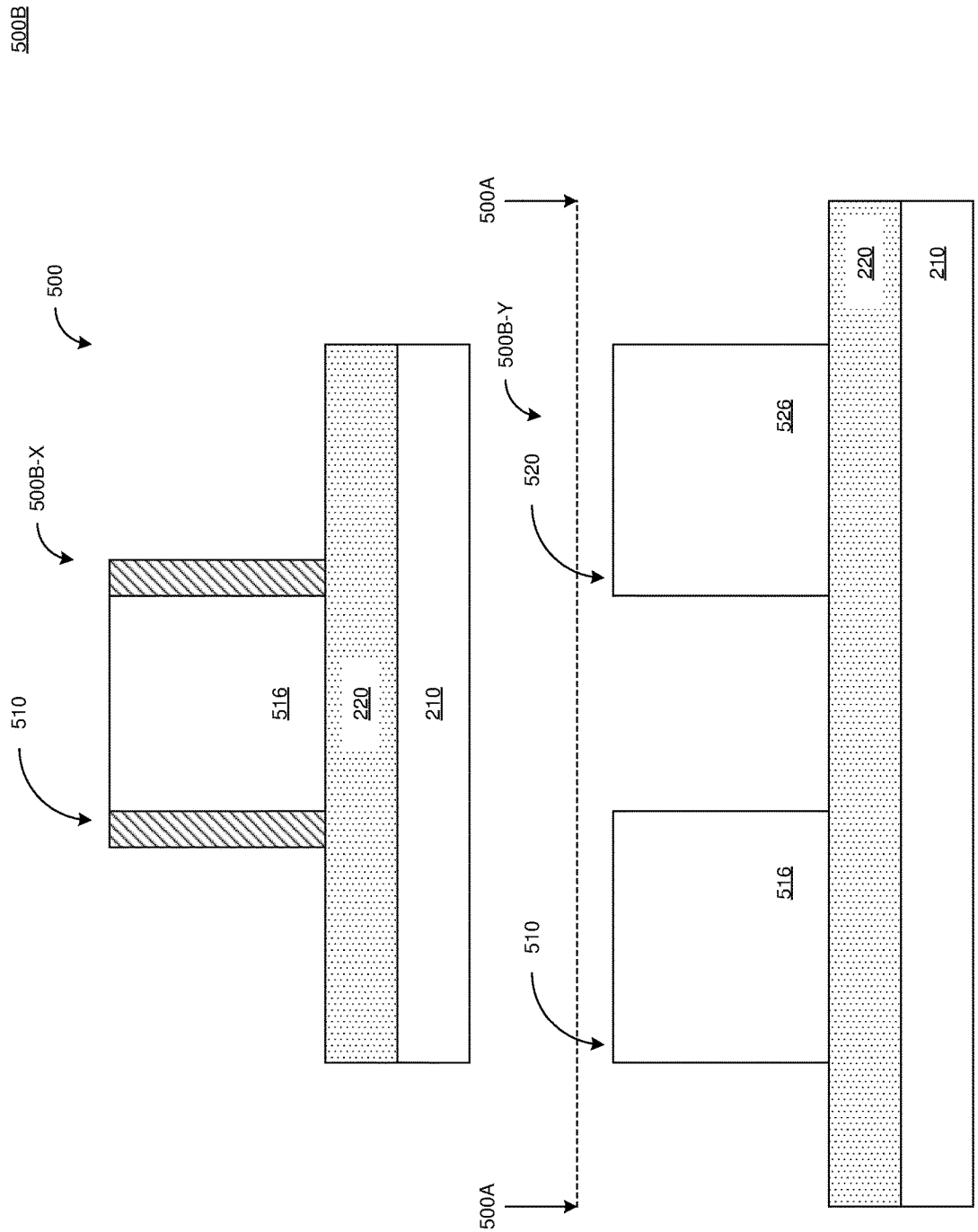
FIG. 5B illustrates side views of a fourth step of fabricating a device, further to the plan view of FIG. 5A, according to an embodiment.

FIG. 5B illustrates side views of a fourth step of fabricating a device, further to the plan view of FIG. 5A, according to an embodiment. A partially fabricated device 500 in side views 500B, including side view 500B-X and side view 500B-Y, can include the substrate 210, the dielectric base layer 220, the first dielectric core 516 of the first transistor core 510 and the second dielectric core 526 of the second transistor core 520.

Figure 6A:
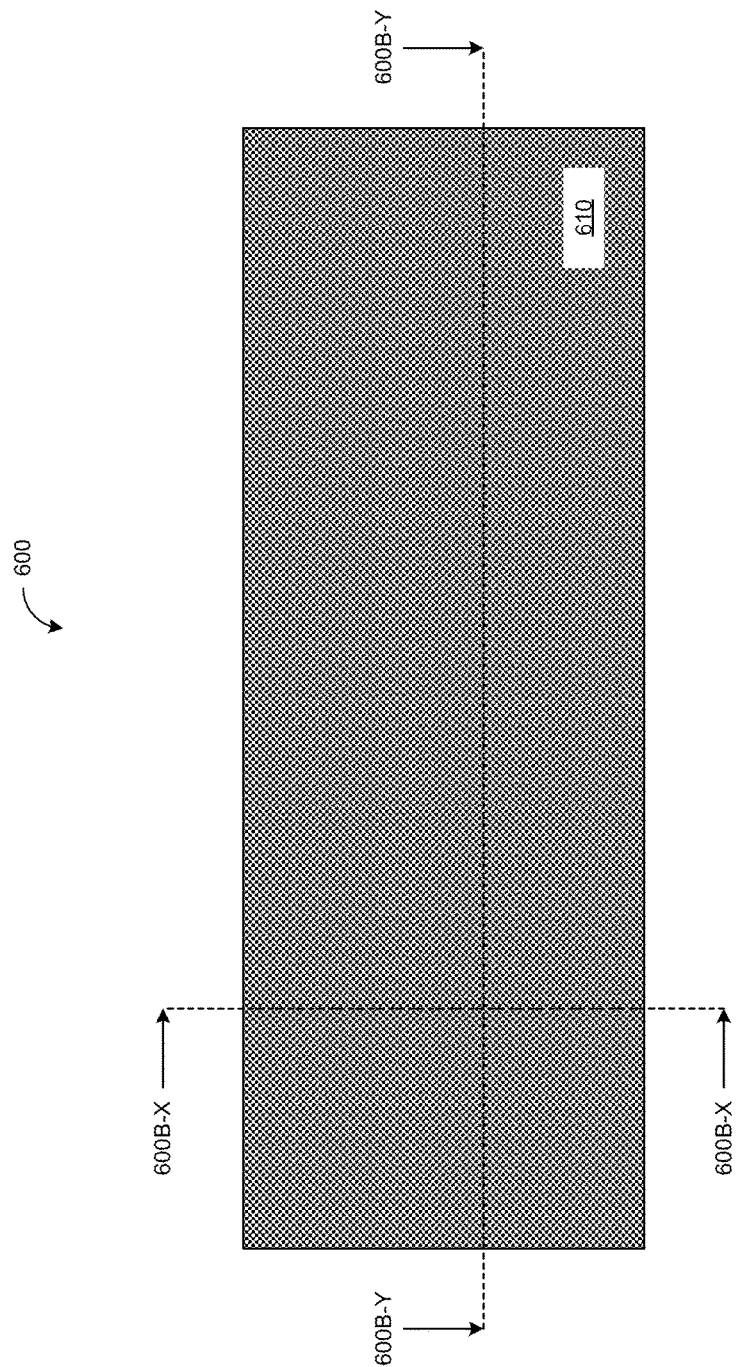
FIG. 6A illustrates a plan view of a fifth step of fabricating a device, according to an embodiment.

FIG. 6A illustrates a plan view of a fifth step of fabricating a device, according to an embodiment. A partially fabricated device 600 in a plan view 600A can include a two-dimensional composition layer 610. As one example, the two-dimensional composition layer 610 can include a material having a planar atomic structure. The two-dimensional composition layer 610 may include a material that can be selected from the group consisting of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and combinations thereof. As another example, the two-dimensional composition layer 610 can include graphene. The two-dimensional composition layer 610 can at least partially cover the first transistor core 510, the second transistor core 520, and the dielectric base layer 220.

Additionally or alternatively, the techniques provided herein may utilize semiconductive behaving oxides (sometimes referred to herein as "conductive oxides"), which may have similar properties to semiconductor materials, to fabricate vertical 3D transistors. For example, certain materials, when combined with oxygen, may form new materials that exhibit semiconductor properties (e.g., can turn "off" with low off-state leakage current or can become highly conductive under certain circumstances). Some examples of N-type semiconductive behaving oxides include $In_2O_3$, $SnO_2$, InGaZnO, and ZnO. One example of a P-type conductive channel is SnO. For the sake of simplicity, the use of 2D semiconductor materials will be disclosed.

Figure 6B:
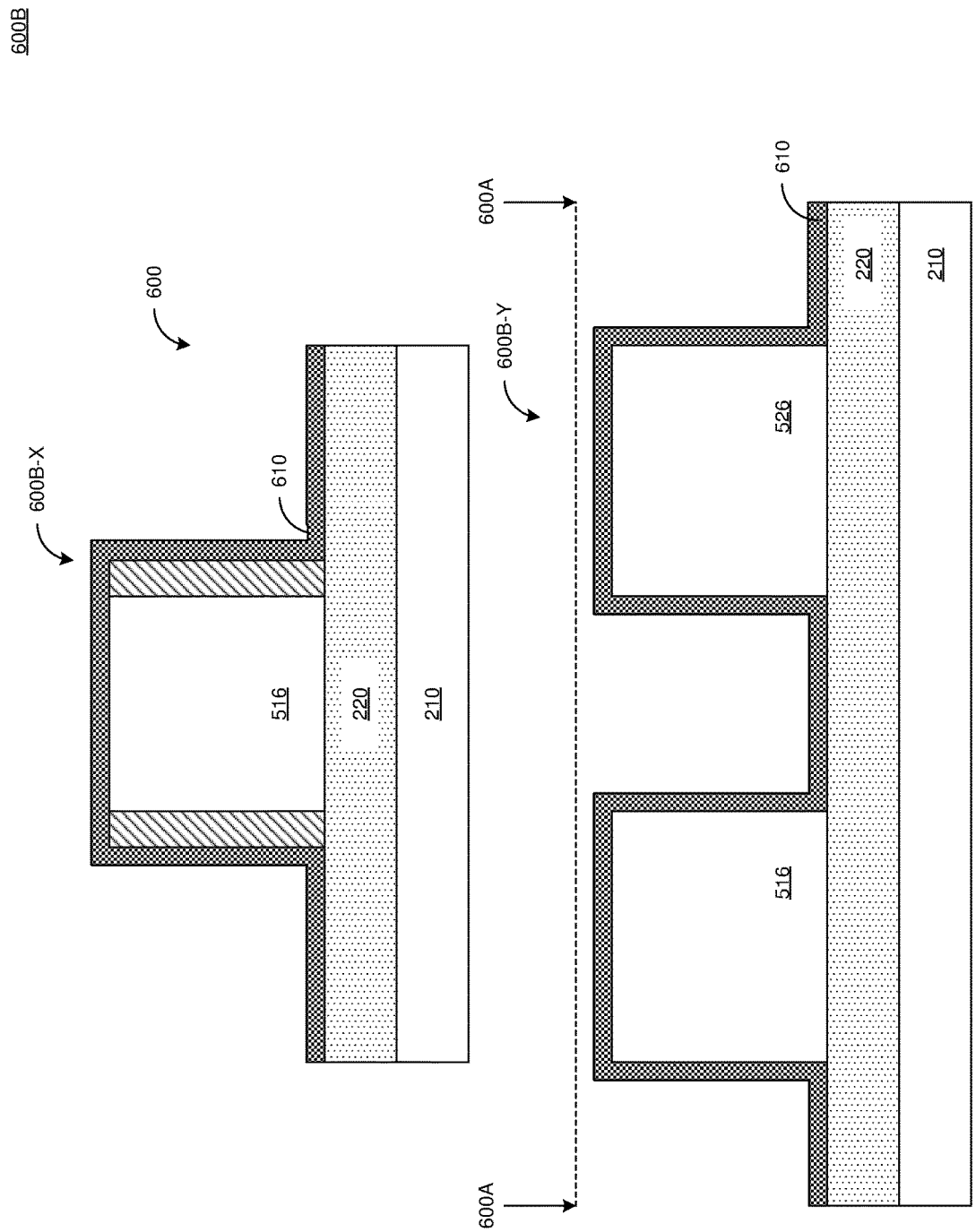
FIG. 6B illustrates side views of a fifth step of fabricating a device, further to the plan view of FIG. 6A, according to an embodiment.

FIG. 6B illustrates side views of a fifth step of fabricating a device, further to the plan view of FIG. 6A, according to an embodiment. A partially fabricated device 600 in side views 600B, including side view 600B-X and side view 600B-Y, can include the substrate 210, the dielectric base layer 220, the first dielectric core 516 of the first transistor core 510, the second dielectric core 526 of the second transistor core 520, and the two-dimensional composition layer 610.

Figure 7:
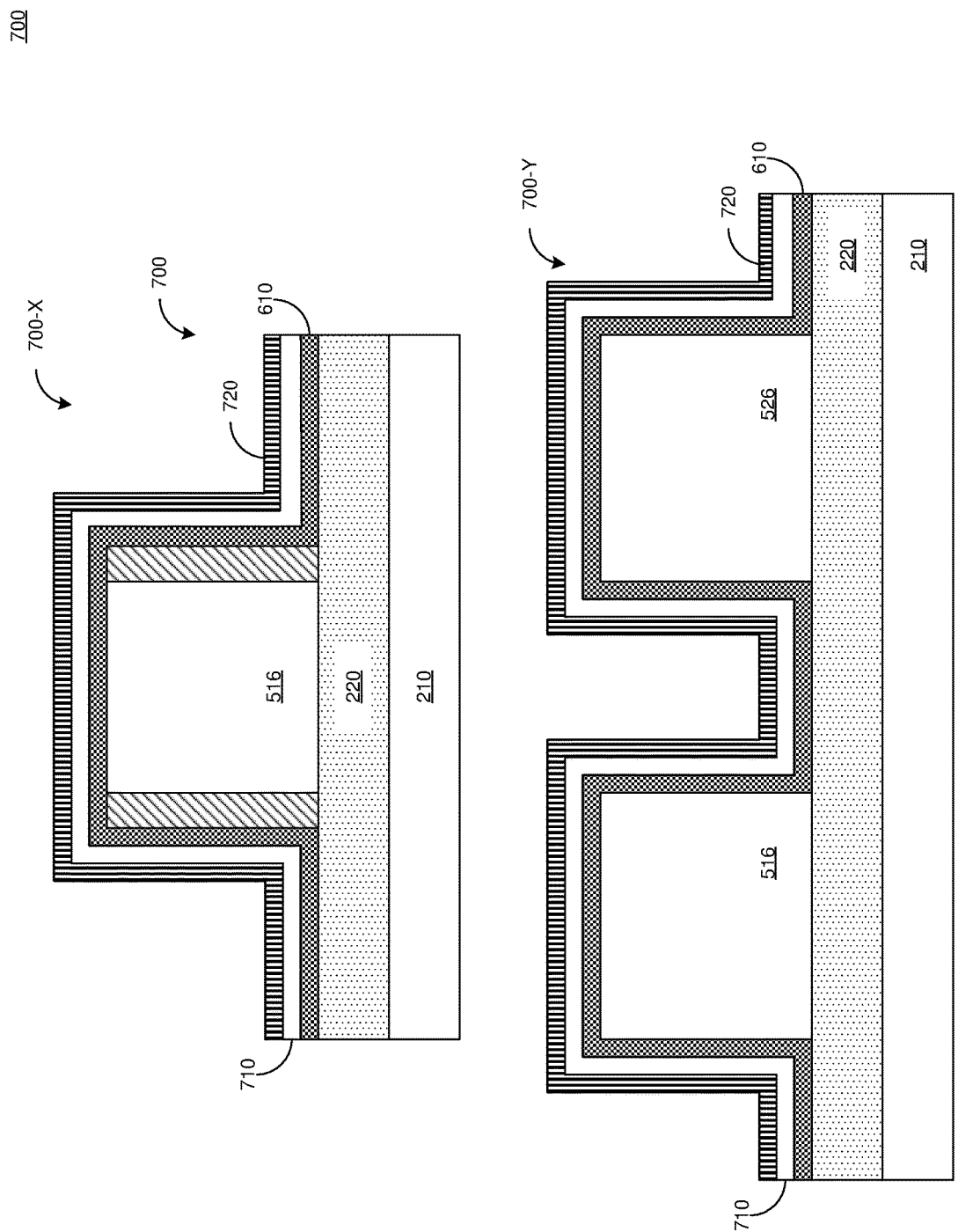
FIG. 7 illustrates side views of a sixth step of fabricating a device, according to an embodiment.

FIG. 7 illustrates side views of a sixth step of fabricating a device, according to an embodiment. A partially fabricated device 700 in side views 700B, including side view 700B-X and side view 700B-Y, can include the substrate 210, the dielectric base layer 220, the first dielectric core 516 of the first transistor core 510, the second dielectric core 526 of the second transistor core 520, the two-dimensional composition layer 610, a high-k gate layer 710, and a gate electrode layer 720.

The high-k gate layer 710 can include a material having a dielectric constant different than the dielectric base layer 220 or the dielectric core layer 230. As one example, the high-k gate layer 710 can include a material having a dielectric constant higher than the dielectric base layer 220 and the dielectric core layer 230. The high-k gate layer 710 can be disposed on the two-dimensional composition layer 610. The gate electrode layer 720 can include a material including a metal and can be disposed on or over the high-k gate layer 710.

Figure 8:
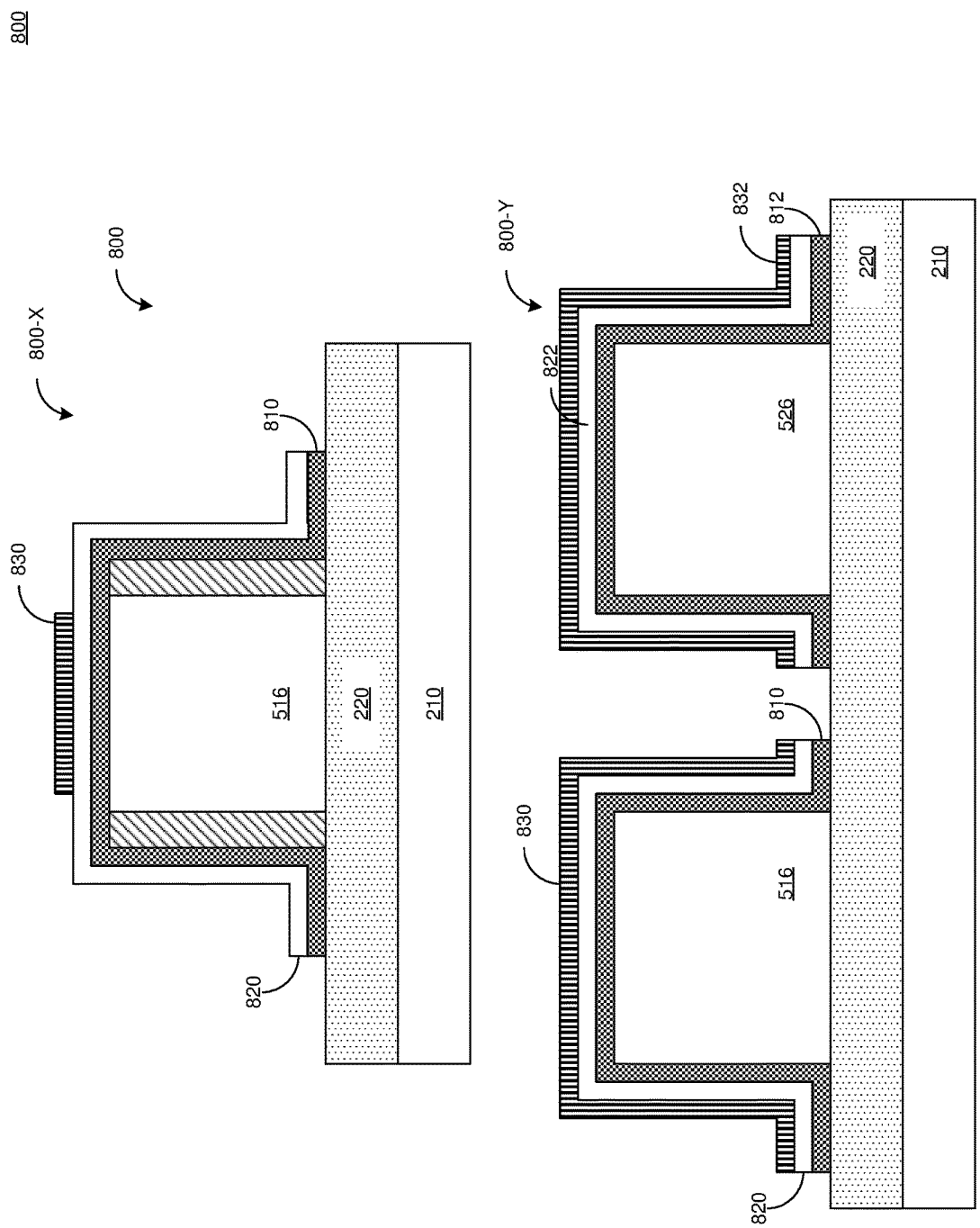
FIG. 8 illustrates side views of a seventh step of fabricating a device, according to an embodiment.

FIG. 8 illustrates side views of a seventh step of fabricating a device, according to an embodiment. A partially fabricated device 800 in side views 800B, including side view 800B-X and side view 800B-Y, can include the substrate 210, the dielectric base layer 220, the first dielectric core 516 of the first transistor core 510, the second dielectric core 526 of the second transistor core 520, two-dimensional composition layers 810 and 812, high-k gate layers 820 and 822, and gate electrodes 830 and 832.

The two-dimensional composition layers 810 and 812 can be formed from the two-dimensional composition layer 610 and can include separate portions each at least partially disposed over a corresponding transistor core of the transistor cores 516 and 526. As one example, portions of the two-dimensional composition layer 610 proximate to or at a boundary of the dielectric base layer 220, or the substrate 210 can be removed to form the two-dimensional composition layers 810 and 812. As another example, portions of the two-dimensional composition layer 610 between the transistor cores 516 and 526 can be removed to form the two-dimensional composition layers 810 and 812.

The high-k gate layers 820 and 822 can be formed from the high-k gate layer 710 and can include separate portions each at least partially disposed over a corresponding transistor core of the transistor cores 516 and 526. As one example, portions of the high-k gate layer 710 proximate to or at a boundary of the dielectric base layer 220, or the substrate 210 can be removed to form the high-k gate layers 820 and 822. As another example, portions of the high-k gate layer 710 between the transistor cores 516 and 526 can be removed to form the high-k gate layers 820 and 822.

The gate electrodes 830 and 832 can be formed from the gate electrode layer 720 and can include separate portions each at least partially disposed over a corresponding transistor core of the transistor cores 516 and 526. As one example, portions of the gate electrode layer 720 proximate to or at a boundary of the dielectric base layer 220 or the substrate 210 can be removed to form the gate electrodes 830 and 832. As another example, portions of the gate electrode layer 720 between the transistor cores 516 and 526 in a Y-axis direction can be removed to form the gate electrodes 830 and 832. As another example, portions of the gate electrode layer 720 extending beyond the transistor cores 516 and 526 in an X-axis direction can be removed to form the gate electrodes 830 and 832. Thus, the gate electrodes 830 and 832 can be formed as strips extending across transistor cores 516 and 526, respectively, in a Y-axis direction.

Figure 9:
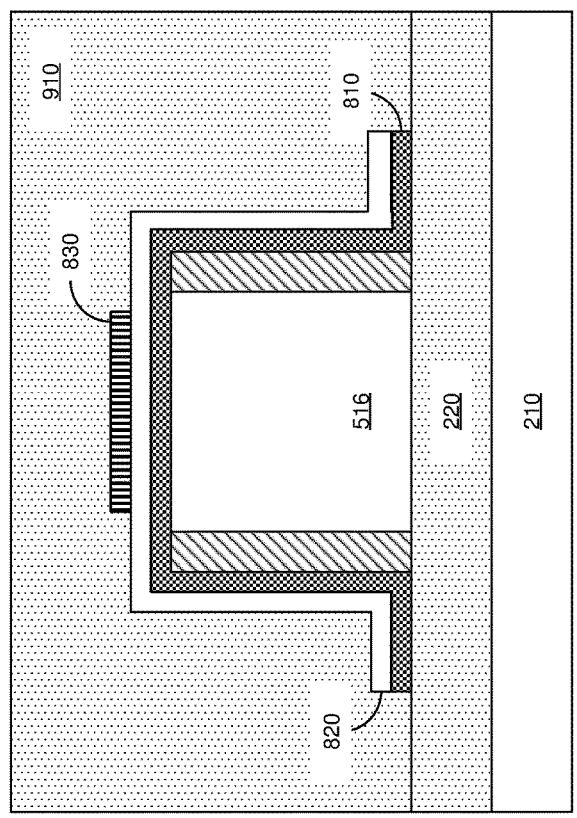
FIG. 9 illustrates a side view of an eighth step of fabricating a device, according to an embodiment.

FIG. 9 illustrates a side view of an eighth step of fabricating a device, according to an embodiment. A partially fabricated device in side view 900 can include the substrate 210, the dielectric base layer 220, the first dielectric core 516 of the first transistor core 510, the two-dimensional composition layer 810, the high-k gate layer 820, the gate electrode 830, and a dielectric encapsulating layer 910. The dielectric encapsulating layer 910 can partially or completely cover the first dielectric core 516 of the first transistor core 510, the two-dimensional composition layer 810, the high-k gate layer 820, the gate electrode 830, and a dielectric encapsulating layer 910 to form a semiconductor device. The dielectric encapsulating layer 910 can be deposited over multiple transistor cores to encapsulate multiple devices over a reduced number of deposition processes. The dielectric encapsulating layer 910 can include a material corresponding to the dielectric base layer 220 to encapsulate a transistor device in a common material.

Figure 10:
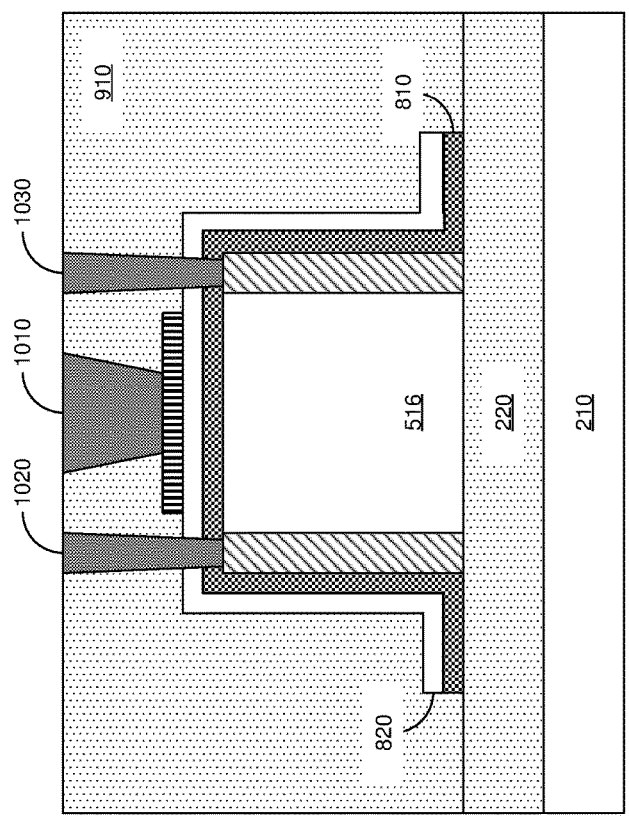
FIG. 10 illustrates a side view of a ninth step of fabricating a device, according to an embodiment.

FIG. 10 illustrates a side view of a ninth step of fabricating a device, according to an embodiment. A partially fabricated device in side view 1000 can include the substrate 210, the dielectric base layer 220, the first dielectric core 516 of the first transistor core 510, the two-dimensional composition layer 810, the high-k gate layer 820, the gate electrode 830, the dielectric encapsulating layer 910, a gate transistor terminal 1010, a source transistor terminal 1020, and a drain transistor terminal 1030.

The gate transistor terminal 1010 can include a metallic material and can extend from a surface of the gate electrode 830 to a surface of the dielectric encapsulating layer 910. The gate transistor terminal 1010 can extend through the dielectric encapsulating layer 910 and can have a top surface substantially flush with, aligned with, or at a corresponding level to, a top surface of the dielectric encapsulating layer 910. The source transistor terminal 1020 can include a metallic material and can extend from a surface of a first sidewall of the transistor core 516 to a surface of the dielectric encapsulating layer 910. The source transistor terminal 1020 can extend through the two-dimensional composition layer 810, the high-k gate layer 820, and the dielectric encapsulating layer 910 and can have a top surface substantially flush with, aligned with, or at a corresponding level to, a top surface of the dielectric encapsulating layer 910. The drain transistor terminal 1030 can include a metallic material and can extend from a surface of a second sidewall of the transistor core 516 to a surface of the dielectric encapsulating layer 910. The drain transistor terminal 1030 can extend through the two-dimensional composition layer 810, the high-k gate layer 820, and the dielectric encapsulating layer 910 and can have a top surface substantially flush with, aligned with, or at a corresponding level to, a top surface of the dielectric encapsulating layer 910. In one configuration, a dielectric liner (not shown) may be deposited to isolate one or more of the terminals from the 2D material.

Figure 11A:
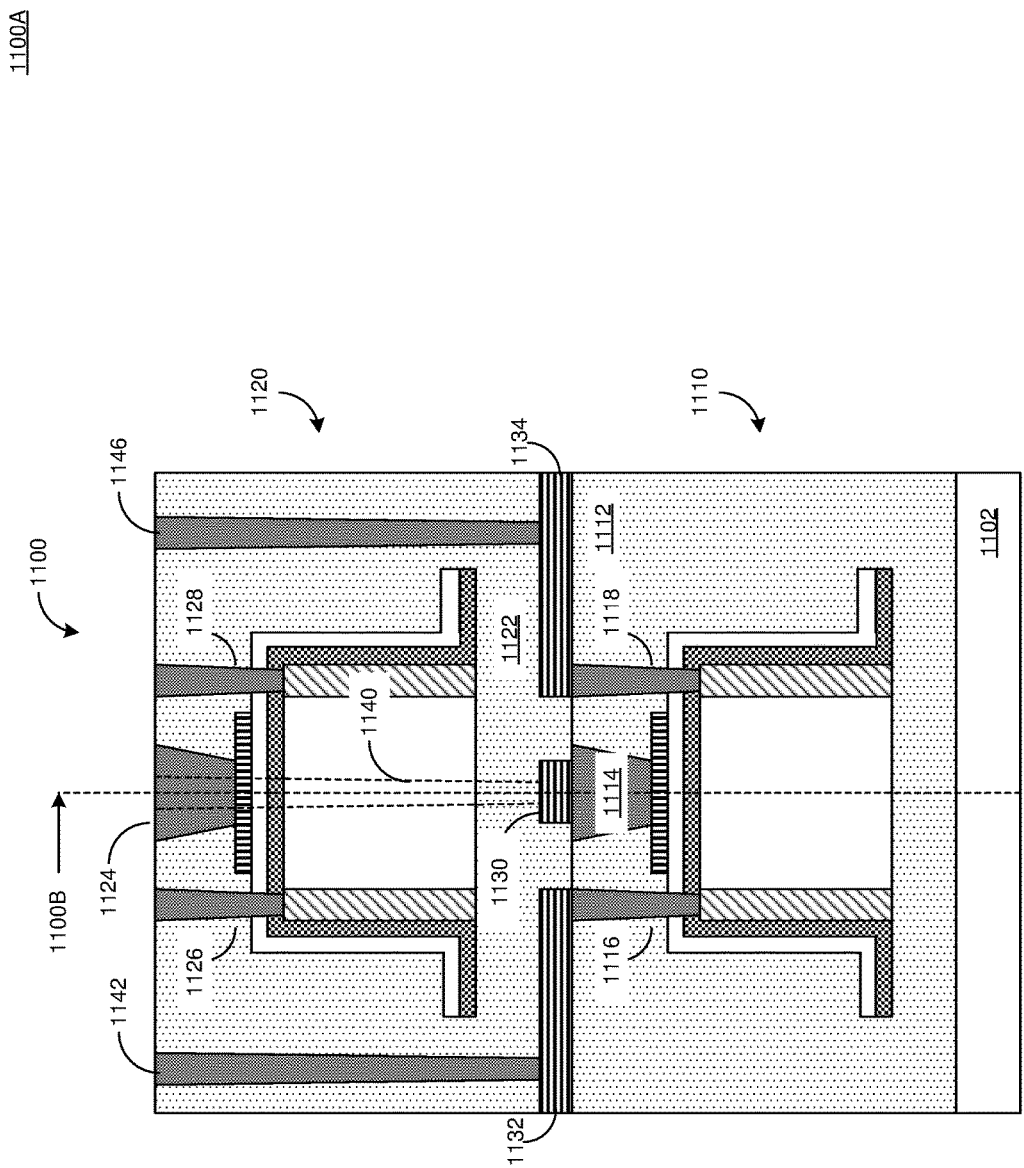
FIG. 11A illustrates a first side view of a step of fabricating stacked devices, according to an embodiment.

FIG. 11A illustrates a first side view of a step of fabricating stacked devices, according to an embodiment. A partially fabricated device in a side view 1100A can include a substrate 1102, a first transistor device 1110, a second transistor device 1120, a gate lead 1130, a source lead 1132, a drain lead 1134, a stacking gate transistor terminal 1140, a stacking source transistor terminal 1142, and a stacking drain transistor terminal 1146. The gate transistor terminal 1140 may be a post extending through the upper transistor device 1120 to contact with the gate terminal 1114 of the lower transistor device 1110. This post may enable a stacking contact at the upper surface of the stack for the gate electrode that may otherwise be blocked by the transistor above it.

The first transistor device 1110 can include a device in accordance with, for example, FIG. 1 or FIG. 10, can include a gate terminal 1114, a source terminal 1116, and a drain terminal 1118 and can be encapsulated by encapsulation 1112. The first transistor device 1110 can be disposed on substrate 1102. The substrate 1102 can include a substrate, including for example substrate 201, on which the first transistor device 1110 is fabricated or is transferred. The second transistor device 1120 can include a device in accordance with, for example, FIG. 1 or FIG. 10, can include a gate terminal 1124, a source terminal 1126, and a drain terminal 1128 and can be encapsulated by encapsulation 1122. The second transistor device 1120 can be disposed on the first transistor device 1110. The second transistor device 1120 can be disposed on the gate lead 1130, the source lead 1132, and the drain lead 1134 and can sandwich those elements together with the first transistor device 1110.

The gate lead 1130 can extend in a first direction from the gate terminal 1114 away from the transistor core of the first transistor device 1110. The gate lead 1130 can include a metal and form a strip disposed at least partially over the transistor core of the first transistor device 1110. The source lead 1132 can extend in a second direction from the source terminal 1116 away from the transistor core of the first transistor device 1110. The source lead 1132 can include a metal material and include a strip disposed at least partially over the transistor core of the first transistor device 1110. The second direction can be substantially orthogonal to the first direction. The drain lead 1134 can extend in a third direction from the drain terminal 1118 away from the transistor core of the first transistor device 1110. The drain lead 1134 can include a metal material and include a strip disposed at least partially over the transistor core of the first transistor device 1110. The third direction can be substantially parallel to the second direction and can extend in a direction opposite to the second direction.

The stacking source transistor terminal 1142 can include a metallic material and can extend from a surface of the source lead 1132 to a surface of the encapsulation 1122 along a first plane. The first plane can be substantially vertical. The stacking source transistor terminal 1142 can extend through the encapsulation 1122 and can have a top surface substantially flush with, aligned with, or at a corresponding level to, a top surface of the encapsulation 1122. The stacking drain transistor terminal 1146 can include a metallic material and can extend from a surface of the drain lead 1134 to a surface of the encapsulation 1122, along the first plane. The stacking drain transistor terminal 1146 can extend through the encapsulation 1122 and can have a top surface substantially flush with, aligned with, or at a corresponding level to, a top surface of the encapsulation 1122.

Figure 11B:
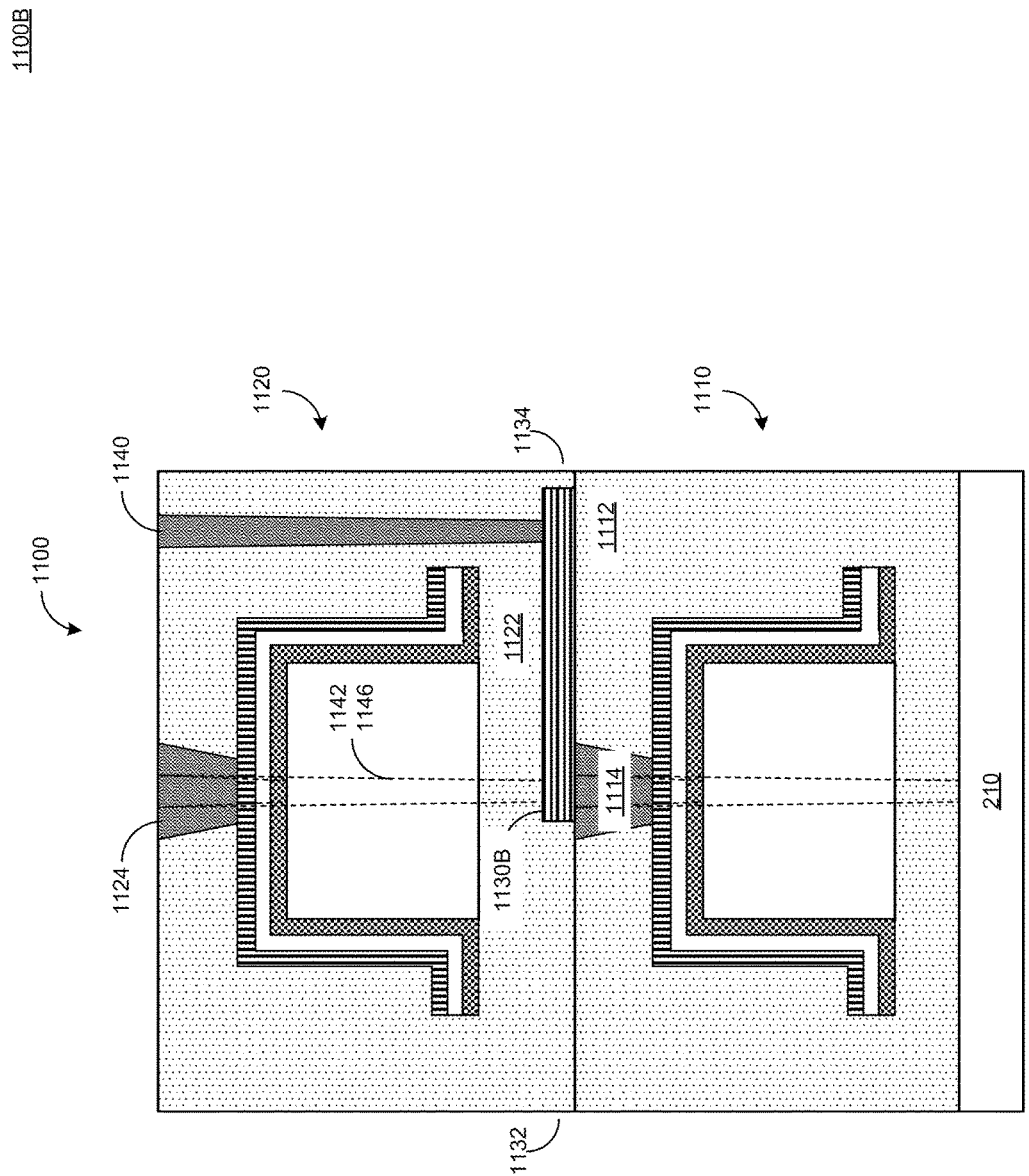
FIG. 11B illustrates a second side view of a step of fabricating stacked devices, further to the first side view of FIG. 11A, according to an embodiment.

FIG. 11B illustrates a second side view of a step of fabricating stacked devices, further to the first side view of FIG. 11A, according to an embodiment. A partially fabricated device in a side view 1100B can include the substrate 1102, the first transistor device 1110, the second transistor device 1120, the gate lead 1130, the source lead 1132, the drain lead 1134, the stacking gate transistor terminal 1140, the stacking source transistor terminal 1142, and the stacking drain transistor terminal 1146.

The stacking gate transistor terminal 1140 can include a metallic material and can extend from a surface of the source lead 1136 to a surface of the encapsulation 1122 along a second plane. The second plane can be a substantially vertical plane substantially orthogonal to the first plane. The stacking gate transistor terminal 1140 can extend through the encapsulation 1122 and can have a top surface substantially flush with, aligned with, or at a corresponding level to, a top surface of the encapsulation 1122.

Figure 12:
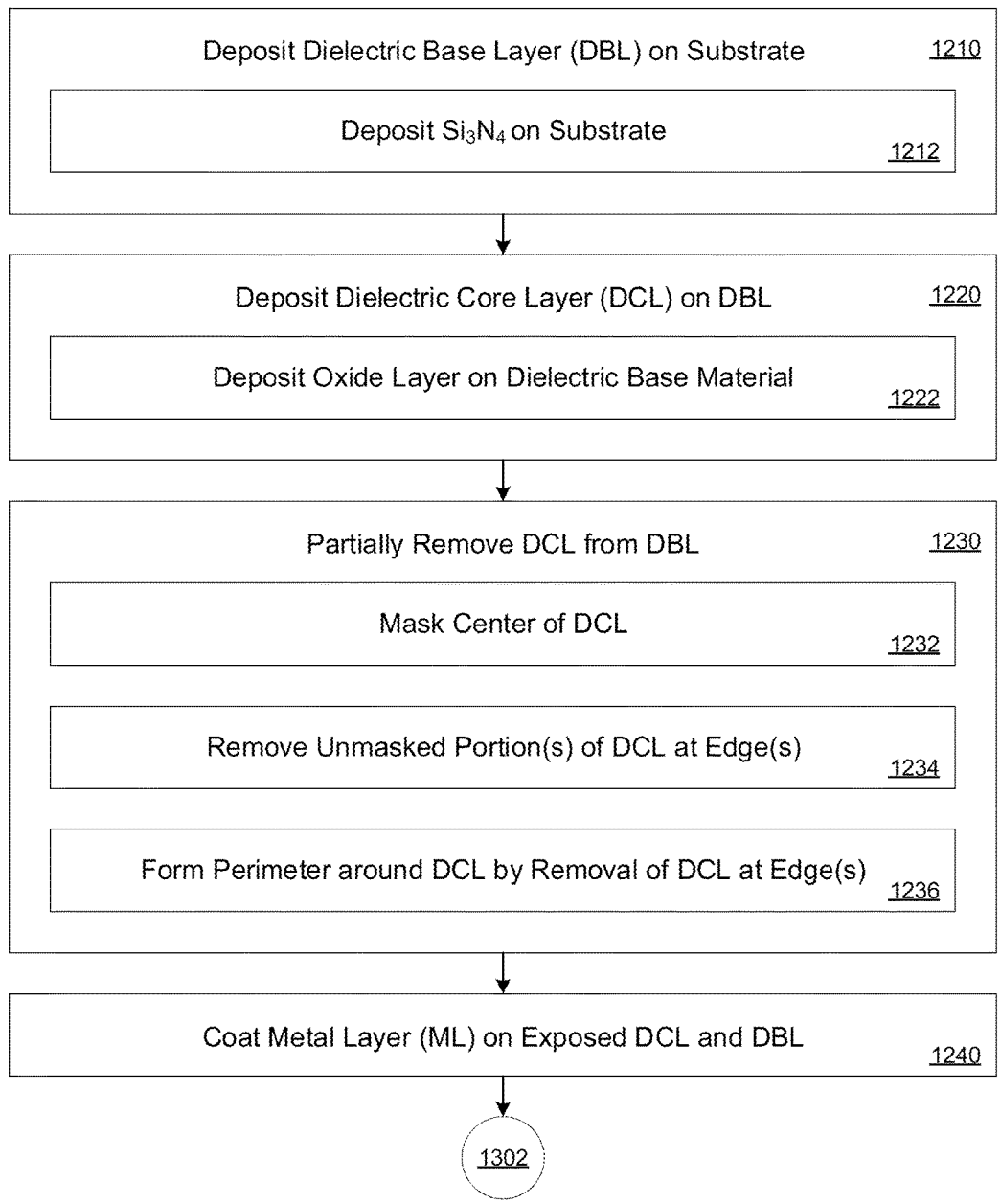
FIG. 12 illustrates a method of manufacturing a device, according to an embodiment.

FIG. 12 illustrates a method of manufacturing a device, according to an embodiment. A method 1200 can result in one or more of the devices illustrates in FIGS. 1-11B, according to present implementations. The method 1200 can begin at step 1210.

At step 1210, the method can deposit a dielectric base layer on a substrate. Step 1210 can include step 1212. At step 1212, the method can deposit silicon nitride ($Si_3N_4$) on the substrate. The substrate can be any solid or solid-like material, including but not limited to glass. The method 1200 can then continue to step 1220.

At step 1220, the method can deposit a dielectric core layer on the dielectric base layer. Step 1220 can include step 1222. At step 1222, the method can deposit an oxide layer on the dielectric base material. The method 1200 can then continue to step 1230.

At step 1230, the method can remove at least a portion of the dielectric core layer from the dielectric base layer. Step 1230 can include at least one of steps 1232, 1234 and 1236. At step 1232, the method can apply a mask to a center of the dielectric core layer. As one example, a center can include a central region of the dielectric core layer as viewed from a plan view. At step 1234, the method can remove an unmasked portion of the dielectric core layer, where the unmasked portion corresponds to edges of the dielectric core layer. The edges of the dielectric core layer can include, for example, edges of the dielectric core layer as viewed from a plan view. At step 1236, the method can form a perimeter around the dielectric core layer by removal of the dielectric core layer at the edges. The perimeter can include an exposed portion of the dielectric base layer surrounding the dielectric core layer in a plan view. The method 1200 can then continue to step 1240.

At step 1240, the method can coat a metal layer on the exposed dielectric core layer and on the exposed dielectric base layer. The method 1200 can then continue to step 1302.

Figure 13:
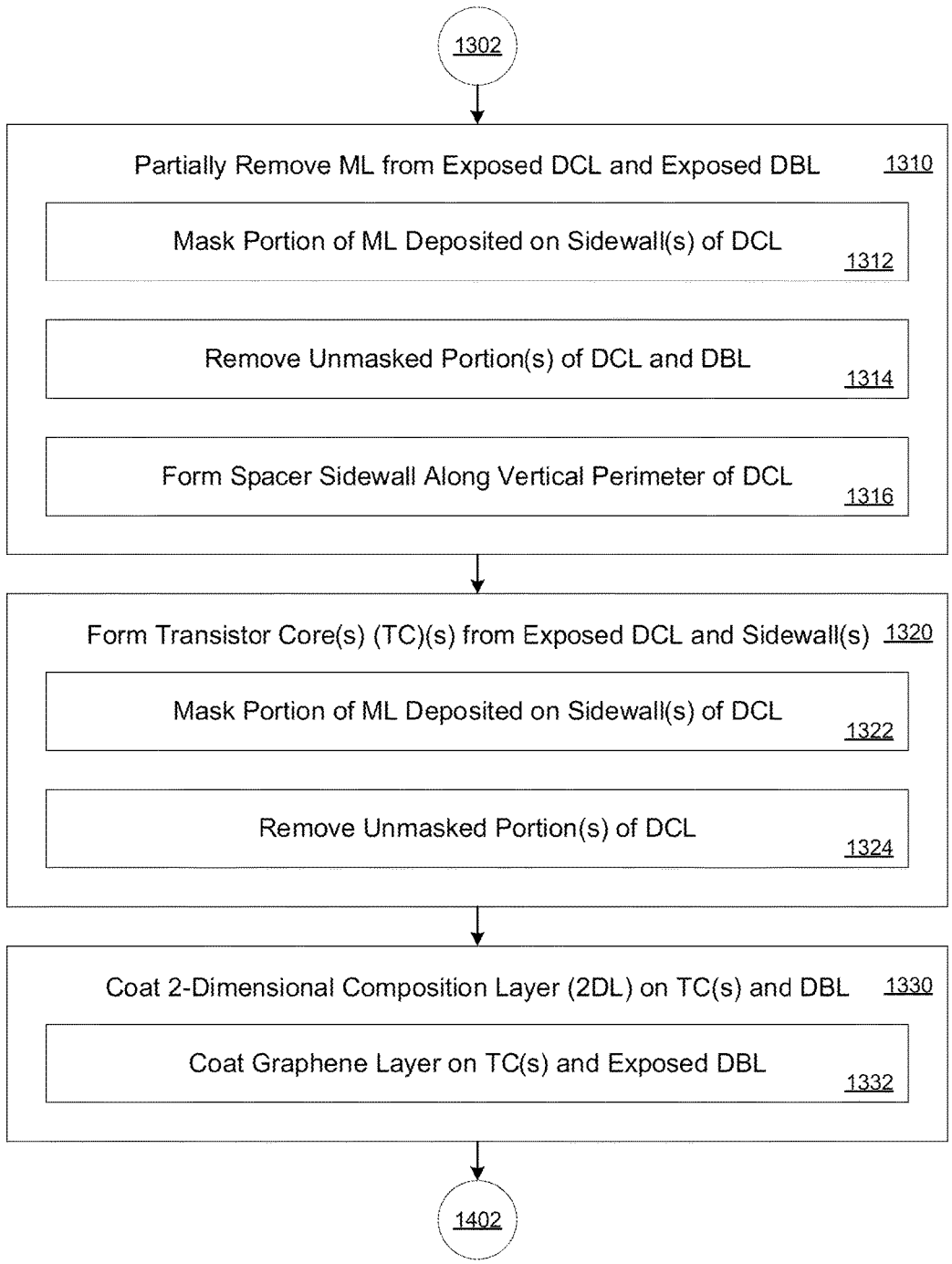
FIG. 13 illustrates a method of manufacturing a device further to the method of FIG. 12, according to an embodiment.

FIG. 13 illustrates a method of manufacturing a device further to the method of FIG. 12, according to an embodiment. Method 1300 can result in one or more of the devices illustrates in FIGS. 1-11B, according to present implementations. The method 1300 can begin at step 1302. The method 1300 can then continue to step 1310.

At step 1310, the method can remove at least a portion of the metal layer from the exposed dielectric core layer and the exposed dielectric base layer. Step 1310 can include at least one of steps 1312, 1314 and 1316. At step 1312, the method can mask at least a portion of the metal layer corresponding to sidewalls of the dielectric core layer. As one example, the method can deposit a mask over portions of the metal layer disposed adjacent to one or more sidewalls of the dielectric core layer in a plan view. At step 1314, the method can remove unmasked portions of the dielectric core layer. At step 1316, the method can form one or more spacer sidewalls along one or more vertical perimeters of the dielectric core layer. As one example, the method can form a metal layer on at least one vertical face of the dielectric core layer. The method 1300 can then continue to step 1330.

At step 1320, the method can form at least one transistor core from the exposed dielectric core layer and the sidewall metal layers. Step 1320 can include at least one of steps 1322 and 1324. At step 1322, the method can mask a portion of the metal layer deposited adjacent to one or more sidewalls of the dielectric core layer. At step 1324, the method can remove the unmasked portion of the dielectric core layer. As one example, the method can remove unmasked portions of the dielectric core layer to separate portions of the dielectric core layers into distinct transistor cores. The method 1300 can then continue to step 1330.

At step 1330, the method can coat a 2D composition layer on the transistor core and the dielectric base layer. The 2D composition layer can include graphene or the like. Step 1330 can include step 1332. At step 1332, the method can coat a graphene layer on at least one transistor core. The method can also, for example, coat the graphene layer or the like on the exposed dielectric base layer. The method 1300 can then continue to step 1402.

Figure 14:
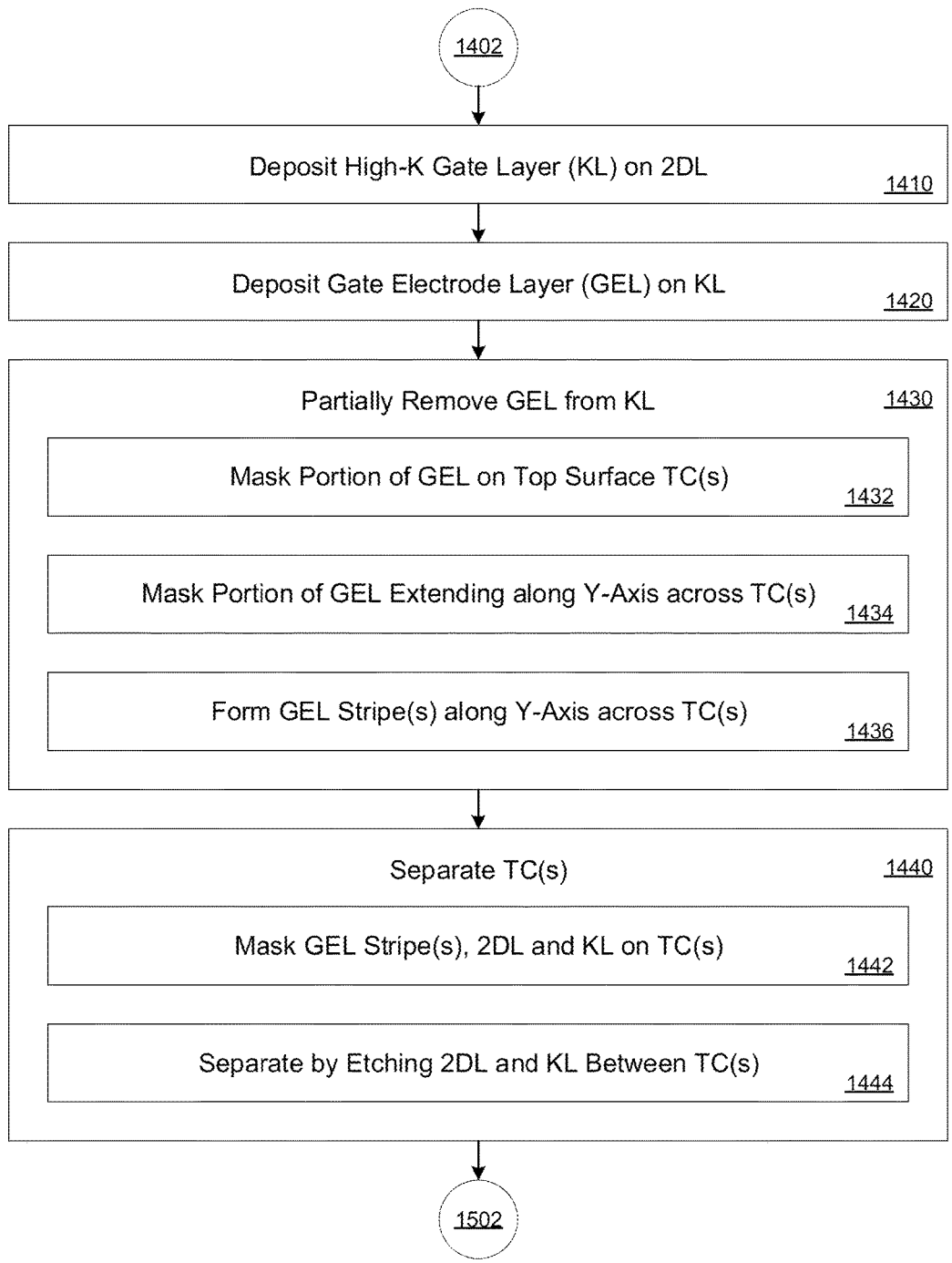
FIG. 14 illustrates a method of manufacturing a device further to the method of FIG. 13, according to an embodiment.

FIG. 14 illustrates a method of manufacturing a device further to the method of FIG. 13, according to an embodiment. A method 1400 can result in one or more of the devices illustrates in FIGS. 1-11B, according to present implementations. The method 1400 can begin at step 1402. The method 1400 can then continue to step 1410.

At step 1410, the method can deposit a high-k gate layer on the 2D composition layer. The method 1400 can then continue to step 1420. At step 1420, the method can deposit a gate electrode layer on the high-k gate layer. The method 1400 can then continue to step 1430.

At step 1430, the method can partially remove the gate electrode layer from the high-k gate layer. Step 1430 can include at least one of steps 1432, 1434 and 1436. At step 1432, the method can mask at least a portion of the gate electrode layer on a top surface of at least one transistor core, as view from a plan view. At step 1434, the method can mask at least a portion of a gate electrode layer extending along a y-axis across one or more transistor cores. At step 1436, the method can form gate electrode layer strips along the y-axis and across one or more transistor cores. The method 1400 can then continue to step 1440.

At step 1440, the method can separate one or more transistor cores from each other. Step 1440 can include at least one of steps 1442 and 1444. At step 1442, the method can mask the gate electrode layer strips, the 2D composition layer, and the high-k gate layer disposed on and over the transistor cores. At step 1444, the method can separate one or more transistor cores from each other by etching away the gate electrode layer strips, the 2D composition layer, and the high-k gate layer disposed between the transistor cores. The method 1400 can then continue to step 1502.

Figure 15:
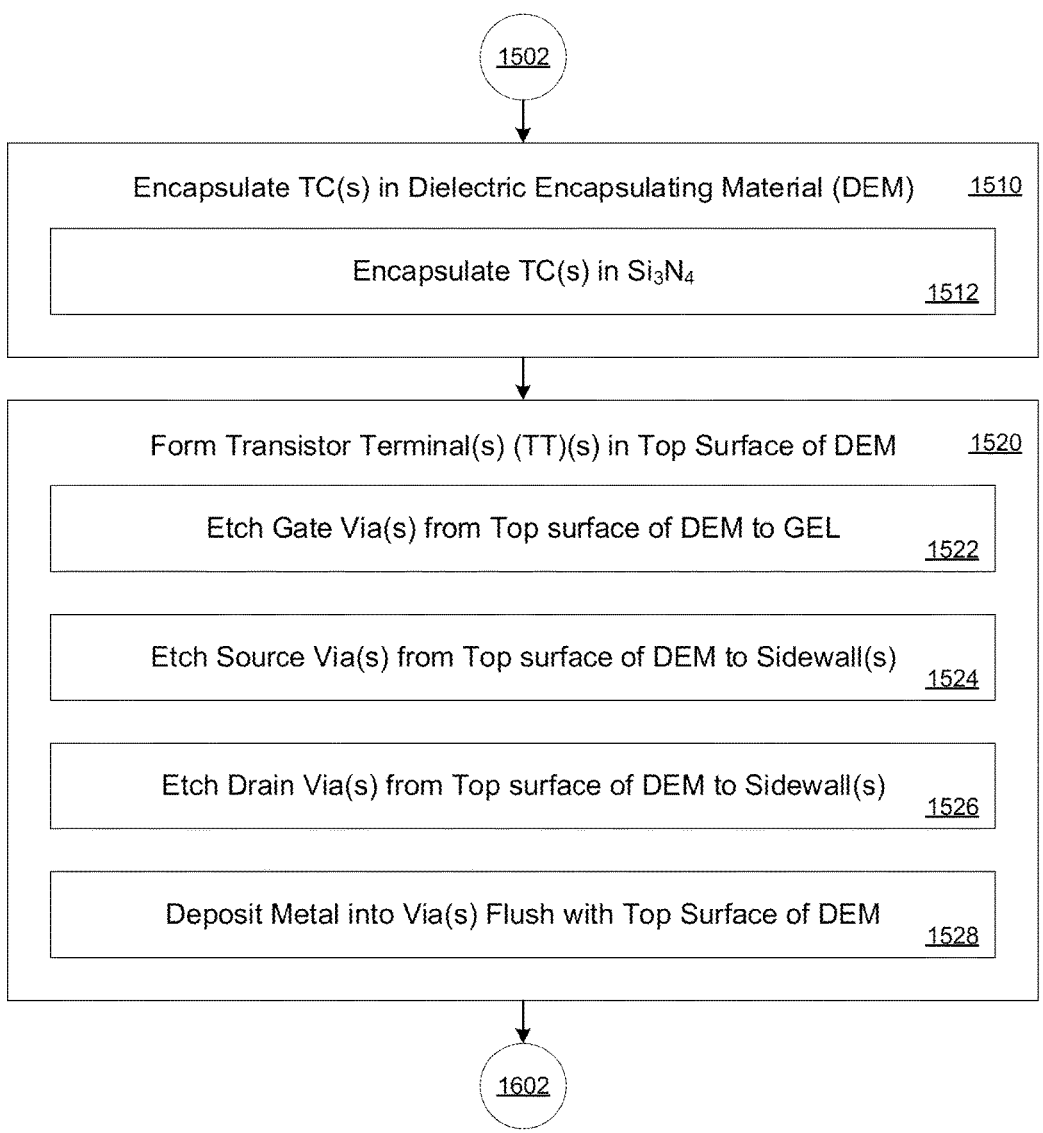
FIG. 15 illustrates a method of manufacturing a device further to the method of FIG. 14, according to an embodiment.

FIG. 15 illustrates a method of manufacturing a device further to the method of FIG. 14, according to an embodiment. Method 1500 can result in one or more of the devices illustrates in FIGS. 1-11B, according to present implementations. The method 1500 can begin at step 1502. The method 1500 can then continue to step 1510.

At step 1510, the method can encapsulate at least one transistor core in dielectric encapsulating material. Step 1510 can include step 1512. At step 1512, the method can encapsulate at least one transistor core in silicon nitride. As one example, the transistor core can be encapsulated in silicon nitride by the encapsulating material and the dielectric base layer. The method 1500 can then continue to step 1520.

At step 1520, the method can form at least one transistor terminal in a top surface of the dielectric encapsulating material. Step 1520 can include at least one of steps 1522, 1524, 1526 and 1528. At step 1522, the method can etch at least one gate via from a top surface, in a plan view, of the dielectric encapsulating material to the gate electrode layer. At step 1524, the method can etch at least one source via from a top surface, in a plan view, of the dielectric encapsulating material to a first metal sidewall of the transistor core. At step 1526, the method can etch at least one drain via from a top surface, in a plan view, of the dielectric encapsulating material to a second metal sidewall of the transistor core. At step 1528, the method can deposit metal into one or more of the etched vias. As one example, the vias can be flush with the top surface of the dielectric encapsulating material. The method 1500 can then continue to step 1602.

Figure 16:
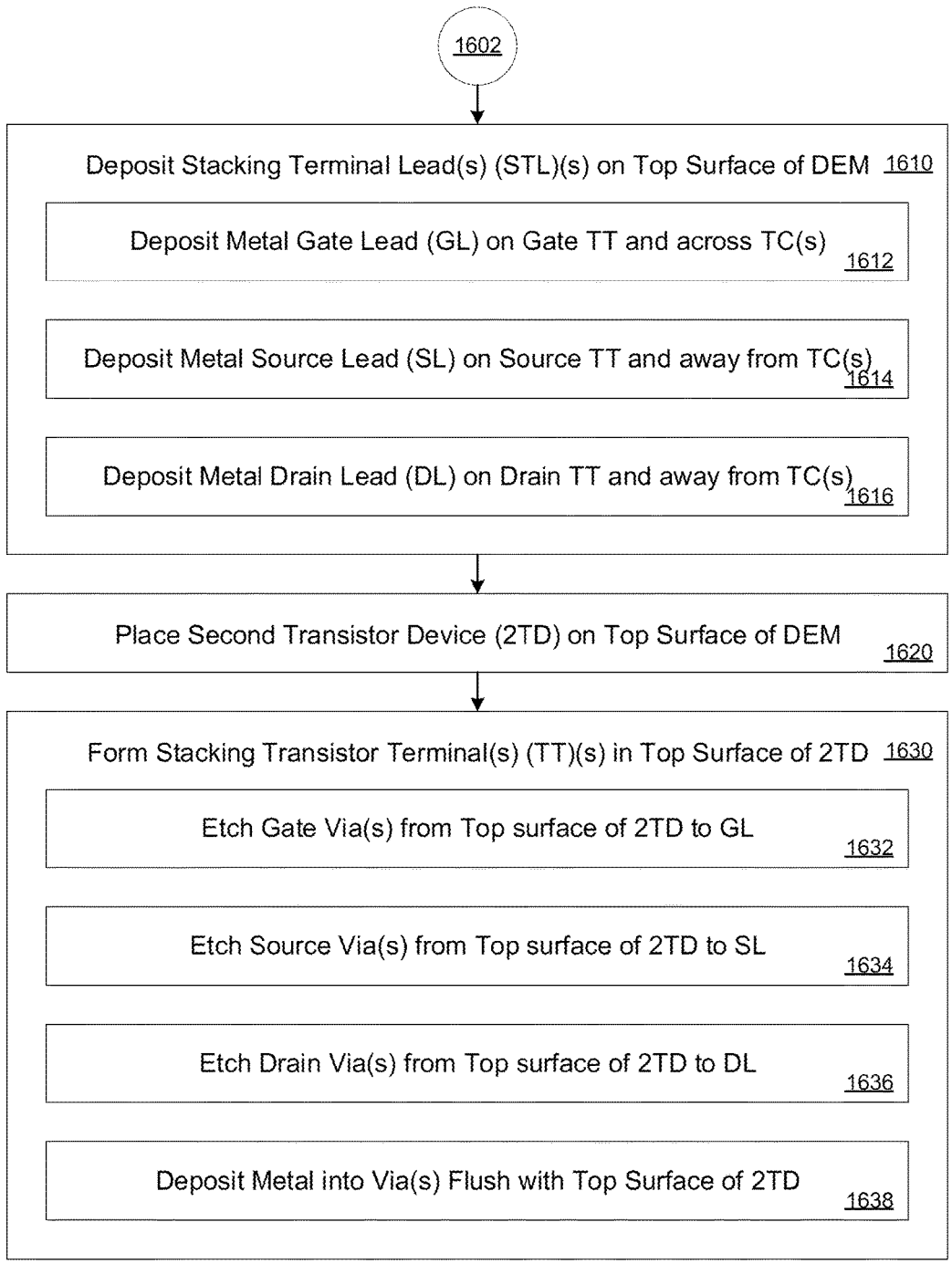
FIG. 16 illustrates a method of manufacturing a device further to the method of FIG. 15, according to an embodiment.

FIG. 16 illustrates a method of manufacturing a device further to the method of FIG. 15, according to an embodiment. A method 1600 can result in one or more of the devices illustrates in FIGS. 1-11B, according to present implementations. The method 1600 can begin at step 1602. The method 1600 can then continue to step 1610.

At step 1610, the method can deposit one or more stacking terminal leads on a top surface of a dielectric encapsulating material of a first transistor core. Step 1610 can include at least one of steps 1612, 1614 and 1616. At step 1612, the method can deposit a metal gate lead on a gate transistor terminal and across transistor cores. At step 1614, the method can deposit a metal source lead on a source transistor terminal and away from at least one transistor core. At step 1616, the method can deposit a metal drain lead on a drain transistor terminal and away from at least one transistor core. The method 1600 can then continue to step 1620.

At step 1620, the method can place a second transistor device on a top surface of a dielectric encapsulating material encapsulating a first transistor core. The method 1600 can then continue to step 1630.

At step 1630, the method can form one or more stacking transistor terminals in a top surface of the second transistor device. Step 1630 can include at least one of steps 1632, 1634, 1636 and 1638. At step 1632, the method can etch at least one gate via from a top surface, in a plan view, of the dielectric encapsulating material of the second transistor device to the metal gate lead. At step 1634, the method can etch at least one source via from a top surface, in a plan view, of the dielectric encapsulating material of the second transistor device to the metal source lead. At step 1636, the method can etch at least one drain via from a top surface, in a plan view, of the dielectric encapsulating material of the second transistor device to the metal drain lead. At step 1638, the method can deposit metal into one or more of the etched vias. As one example, the vias can be flush with the top surface of the dielectric encapsulating material. The method 1600 can end at step 1630.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A device comprising:
   a dielectric material;
   a first metal sidewall on the dielectric material, the first metal sidewall extending perpendicular to a substrate;
   a second metal sidewall on an opposing side of the dielectric material; and
   a two-dimensional material disposed on the first metal sidewall, on the dielectric material between the first metal sidewall and the second metal sidewall, and on the second metal sidewall.

2. The device of claim 1, wherein the two-dimensional material is disposed on a vertical surface and upper horizontal surface of first metal sidewall, on the dielectric material between the first metal sidewall and the second metal sidewall, and on a vertical surface and upper horizontal surface of the second metal sidewall.

3. The device of claim 1, further comprising:
   a second dielectric material separated from the dielectric material by an isolating material;
   a third metal sidewall on the second dielectric material, the third metal sidewall extending perpendicular to the substrate;
   a fourth metal sidewall on an opposing side of the second dielectric material; and
   a second two-dimensional material disposed on the third metal sidewall, the second dielectric material between the third metal sidewall and the fourth metal sidewall, and the fourth metal sidewall.

4. The device of claim 1, further comprising a high-k dielectric on the two-dimensional material.

5. The device of claim 4, further comprising:
   a gate electrode disposed on the high-k dielectric, the gate electrode having ends each respectively aligned, along a first lateral direction, with a corresponding one of the first and second metal sidewalls.

6. The device of claim 5, further comprising:
   a second dielectric surrounding the first metal sidewall, the second metal sidewall, the two dimensional material, the gate electrode, and the high-k dielectric.

7. The device of claim 6, wherein the second dielectric comprises silicon nitride.

8. The device of claim 5, further comprising:
   a gate terminal in contact with the gate electrode;
   a source terminal extending through the high-k dielectric and in contact with the first metal sidewall; and
   a drain terminal extending through the high-k dielectric material and in contact with the second metal sidewall.

9. A method of manufacturing a stackable semiconductor device, the method comprising:
   depositing a dielectric base layer;
   forming, over the dielectric base layer, at least one dielectric core structure;
   forming a first metal sidewall and second metal sidewall on the dielectric core; and
   depositing a two-dimensional material on the first metal sidewall, the dielectric core between the first metal sidewall and the second metal sidewall, and the second metal sidewall.

10. The method of claim 9, further comprising forming a high-k dielectric layer on the two-dimensional material.

11. The method of claim 10, further comprising forming a gate electrode on the high-k dielectric layer.

12. The method of claim 9, further comprising:
depositing a dielectric layer on the dielectric base layer; and
removing at least a portion of the dielectric layer to form the dielectric core.

13. The method of claim 9, further comprising:
coating the dielectric core with a metal layer; and
removing at least a portion of the metal layer to form the first and second metal sidewalls on the dielectric core.

14. The method of claim 9, further comprising depositing a gate layer over the two-dimensional material.

15. The method of claim 14, further comprising removing at least a portion of the gate layer to form, over the dielectric core and over the two-dimensional material, the gate electrode, wherein ends of the gate electrode are each respectively aligned, along a lateral direction, with a corresponding one of the first and second metal sidewalls.

16. The method of claim 9, wherein the stackable semiconductor device includes a plurality of transistor devices in a first horizontal direction.

17. The method of claim 16, wherein the stackable semiconductor device includes a plurality of transistor devices in a second horizontal direction substantially orthogonal to the first horizontal direction.

18. The method of claim 9, wherein the stackable semiconductor device includes a plurality of transistor devices in a first vertical direction.

19. A method of manufacturing a device, the method comprising:
forming a dielectric core;
forming a first metal layer and second metal layer on opposing sidewalls of the dielectric core;
depositing a two-dimensional material on a vertical surface and upper horizontal surface of first metal layer, on the dielectric core between the first metal layer and the second metal layer, and on a vertical surface and upper horizontal surface of the second metal layer;
forming a high-k dielectric on the two-dimensional material;
forming a gate electrode on the high-k dielectric;
forming a gate terminal to an upper side of the gate electrode;
forming a source terminal to an upper side of the first metal sidewall; and
forming a drain terminal to an upper side of the second metal sidewall.

20. The method of claim 19, further comprising:
forming a second dielectric core isolated from the dielectric core;
forming a third metal sidewall and fourth metal sidewall on the second dielectric core;
depositing a second two-dimensional material on the third metal sidewall, the second dielectric core between the third metal sidewall and the fourth metal sidewall, and the fourth metal sidewall;
forming a second gate electrode on the second dielectric core;
forming a second gate terminal to an upper side of the second gate electrode;
forming a second source terminal to an upper side of the third metal sidewall; and
forming a second drain terminal to an upper side of the fourth metal sidewall.

* * * * *